United States Patent [19]

Dittmer

[11] Patent Number: 5,164,679
[45] Date of Patent: Nov. 17, 1992

[54] AC POWER AMPLIFIER HAVING CURRENT LIMIT CONTROL

[75] Inventor: Timothy W. Dittmer, Quincy, Ill.

[73] Assignee: Harris Corporation, Melbourne, Fla.

[21] Appl. No.: 818,114

[22] Filed: Jan. 8, 1992

[51] Int. Cl.⁵ ............................................. H03F 1/52
[52] U.S. Cl. .................. 330/298; 330/207 P; 330/276; 330/296
[58] Field of Search .................... 330/298, 207 P, 296, 330/276, 263, 285

[56] References Cited

U.S. PATENT DOCUMENTS

| | | | |
|---|---|---|---|
| 4,301,490 | 11/1981 | Nagel et al. | 330/298 |
| 4,481,553 | 11/1984 | Owen et al. | 330/298 |
| 4,860,154 | 8/1989 | Fazlollahi | 330/298 |
| 5,029,299 | 7/1991 | Rodgers | 330/298 |
| 5,038,112 | 8/1991 | O'Neill | 330/298 |

Primary Examiner—Eugene R. LaRoche
Assistant Examiner—Tan Dinh
Attorney, Agent, or Firm—Tarolli, Sundheim & Covell

[57] ABSTRACT

An AC power amplifier is disclosed for amplifying an AC input signal while limiting the current drawn by the amplifier. The amplifier includes at least one transistor having an input circuit for receiving an AC input signal as well as a DC bias voltage and an output circuit connected to the DC voltage source for drawing current therefrom during conductive periods of the transistor. The transistor exhibits the characteristic of being non-conductive when the AC input signal together with the DC bias voltage are less positive than a DC threshold voltage level and is conductive when the AC input signal and the DC bias voltage are together more positive than the DC threshold voltage level whereupon DC current is drawn by the output circuit from the DC voltage source. The DC current is sensed and a sense signal is provided having a magnitude in accordance therewith. The sense signal is compared with a reference current level and a control signal is provided having a value which varies as a function of the comparison. The control signal is decreased in magnitude when the sense current exceeds the reference current level. The DC bias voltage is then decreased to thereby decrease the conductivity of the transistor and thereby limit the magnitude of the DC current to that of the reference current level.

10 Claims, 1 Drawing Sheet

AC POWER AMPLIFIER HAVING CURRENT LIMIT CONTROL

FIELD OF THE INVENTION

The present invention relates to the art of AC power amplifiers and, more particularly, to improvements for controlling the operation while limiting current flow.

BACKGROUND OF THE INVENTION

It is known in the art to provide an RF signal generator that produces a radio frequency signal at a power level on the order of 25 watts and wherein it may be desirable that the signal be boosted in power to a level on the order of 1 kw. Solid state power amplifiers may be employed for this purpose. However, there are limitations in the power handling capability of such amplifiers. It is common to divide the RF signal and apply the divided signals in several paths, each of which includes an RF power amplifier operating at a level of, for example, 250 watts. The amplified RF signals are then combined with an RF combiner and the combined signal is supplied to an RF load. Normally, such combiners are designed to operate in a particular system (characteristic) impedance such as 50 ohms. Any impedance other than this particular impedance will result in a mismatch at the combiner's output port. This will be reflected back through the combiner to the output port of each power amplifier feeding the combiner. This will change the current drawn by each power amplifier. The current drawn will vary at each power amplifier dependent upon the phase of the returned signal. If the current drawn at a particular amplifier has increased, it may cause the power amplifier to overheat because the dissipated power is too great. Moreover, inherent differences in amplifier gain and phase characteristics will give rise to unequal currents drawn by the severally combined amplifiers.

SUMMARY OF THE INVENTION

In accordance with one aspect of the present invention, there is provided an AC power amplifier for amplifying an AC input signal while limiting the current drawn by the amplifier. The amplifier includes at least one transistor, such as a field effect transistor (FET), having an input circuit for receiving an AC input signal as well as a DC bias voltage and an output circuit connected to a DC voltage source for drawing current from the source when the transistor is conductive. This transistor exhibits the characteristic of being nonconductive when the AC input signal together with the DC bias voltage is less positive than a DC threshold level and is conductive when the AC input signal together with the DC bias voltage is more positive than the DC threshold voltage level so that DC current is drawn by the output circuit from the DC voltage source. The magnitude of the DC current drawn is sensed so as to provide a sense signal having a magnitude in accordance therewith. The sense signal is compared with a reference current level to provide a control signal which has a value that varies as a function of the comparison. Circuitry is provided that responds to the control signal for purposes of decreasing the DC bias voltage when the sensed current signal exceeds the reference current level to thereby decrease the conductivity of the transistor and limit the magnitude of the DC current to that of the reference current level.

BRIEF DESCRIPTION OF THE DRAWINGS

The foregoing and other features of the invention will become more readily apparent from the following description of the preferred embodiment of the invention as taken in conjunction with the accompanying drawings which are a part hereof and wherein.

DESCRIPTION OF PREFERRED EMBODIMENT

Figure 1:
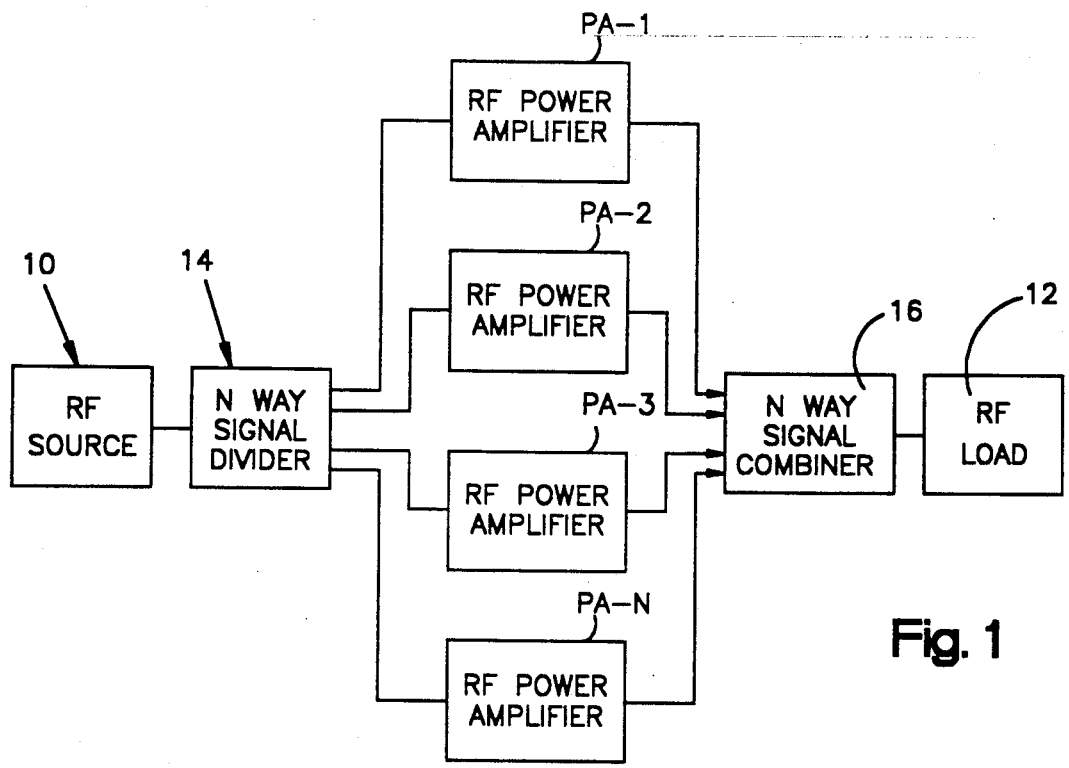
FIG. 1 is a schematic-block diagram illustration of one application of the present invention.

Reference is now made to FIG. 1 which illustrates one application of an RF power amplifier employing the present invention. In this application, a system is presented which employs an RF source 10 which produces an RF signal at some power level, such as on the order of 25 watts. It may be desirable that the RF signal from source 10 be boosted in power to 1 kw before being supplied to an RF load 12. Solid state power amplifiers are frequently employed for increasing the power level. There are limitations in the power handling capability of such amplifiers. It is for this reason that it is common to divide the signal to be amplified and apply the divided signals to several paths, each of which includes an RF power amplifier operating at a level of, for example, 250 watts. The amplified signals are then combined and supplied to a load. Such a system is illustrated in FIG. 1 wherein the output from the RF source 10 is supplied to an N-way signal divider 14 which then divides the signal and supplies the divided signals to N paths. The N paths include power amplifiers PA-1 through PA-N. In the example presented herein N=4 and each power amplifier may boost the power to 250 watts. The amplified signals are then supplied to an N-way signal combiner 16 to produce the final output signal at a power level on the order of 1 kw, which is then applied to the RF load 12.

Typically, power amplifiers such as amplifiers PA-1 through PA-N, and the combiner 16 are designed to operate in a particular system (characteristic) impedance, such as 50 ohms. Any impedance other than this particular impedance will result in a mismatch resulting in a reflected signal at the output circuit of each power amplifier. This changes the current drawn by each power amplifier and the amount of the current drawn will depend on the phase of the returned or reflected signal. If the current drawn increases significantly, the power amplifier may overheat as the dissipated power may be too great. This requires that the current drawn by the power amplifier be decreased to prevent damage to the amplifier.

Figure 2:
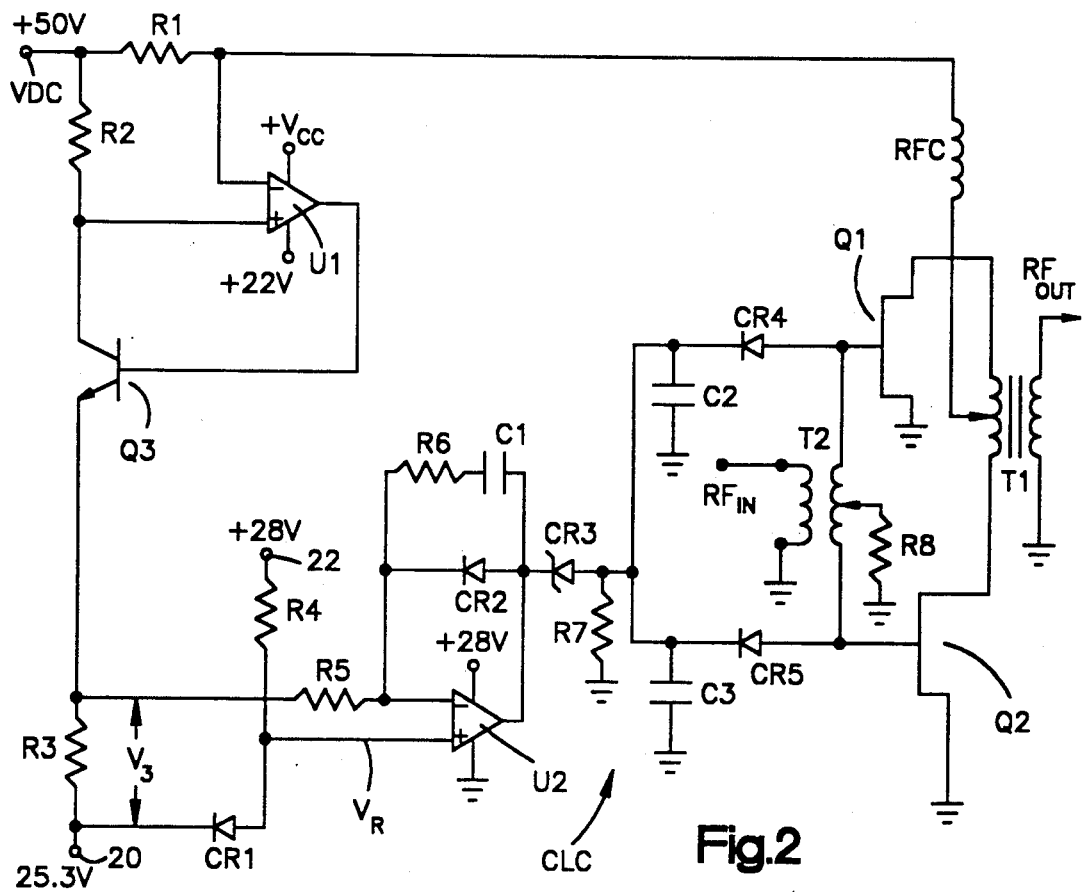
FIG. 2 is a schematic illustration of an RF power amplifier employing current limiting control in accordance with the present invention.

Each power amplifier PA-1 through PA-N is constructed in accordance with that illustrated in FIG. 2 which employs current limiting control circuitry in accordance with the present invention.

The RF amplifier section includes a pair of power transistors Q1 and Q2 each preferably taking the form of a MOSFET field effect transistor (FET). These transistors are connected in a push-pull configuration with their source electrodes connected to ground and their drain electrodes connected to a common load taking the form of the primary winding of a transformer T1 having a secondary winding connected between ground and an RF output terminal which may serve as one input to the N-way signal combiner 16. The input to the RF amplifier is an RF input signal obtained from the N-way signal divider 14 and this signal is supplied to the primary of a transformer T2 having its secondary winding connected between the gates of transistors Q1 and Q2 and wherein the secondary winding also has a midtap taken through a resistor R8 to ground.

The resistor R8 serves as a means for applying a DC gate bias voltage $V_G$ to the gate electrodes of transistors $Q_1$ and $Q_2$ Initially, this gate bias voltage is essentially at ground potential. If desired, a power supply or other circuit may be used to provide a DC gate bias voltage other than ground potential. As will be seen herein, the DC gate bias voltage may be decreased in order to limit the current drawn by the amplifier.

In order for the transistors Q1 and Q2 to be conductive, the voltage supplied by the RF source together with the DC gate bias voltage $V_G$ must be more positive than a threshold voltage $V_T$ associated with that transistor. This threshold voltage level $V_T$ may, for example, be on the order of +3 volts. For example, when transistor Q2 is conducting, current $I_S$ will be drawn from the DC voltage source $V_{DC}$ and thence through a circuit including resistor R1, a choke Coil RFC, the primary winding of transformer T1 and then through the drain-to-source circuit of transistor Q2 to ground. The magnitude of this current may vary depending upon the loading of the power amplifier, as discussed hereinbefore. In the event of an impedance mismatch, the current $I_S$ flowing in this circuit may exceed the current threshold $I_T$ which may result in overheating and cause damage to the field effect transistors Q1 and Q2.

In accordance with the present invention, a current limit controller circuit CLC includes circuitry to sense the magnitude of the bias current $I_S$ drawn by the field effect transistors. This circuitry determines whether the current exceeds the current threshold level $I_T$. If so, the current limit controller will decrease a control voltage $V_C$ to thereby reduce the DC gate bias voltage $V_G$ supplied to the transistors Q1 and Q2. This reduces the conduction angle of the transistors Q1 and Q2 and lowers the bias current $I_S$ drawn by the transistors. This current limit control circuit CLC is described below.

The DC voltage source $V_{DC}$ may be on the order of +50 volts and this voltage level is indicated as such in FIG. 2. Other voltage levels are also indicated in FIG. 2 and these are of the appropriate values for this embodiment of the circuitry when employing a 50 volt source for the source $V_{DC}$. The current $I_S$ drawn by the amplifier flows through a resistor R1, which may be on the order of 0.01 ohms, and is sensed by an operational amplifier U1. This amplifier senses a voltage difference between its inputs and increases the magnitude of its output voltage which is applied to the base of an NPN transistor Q3. This transistor is turned on which causes current to be drawn from the source $V_{DC}$ through a resistor R2, which may be on the order of 220 ohms, and thence through the collector-to-emitter circuit of transistor Q3. This current then flows through a resistor R3, which may be on the order of 1.13 kohms, to a circuit point 20 which may be connected to a DC voltage supply on the order of 25.3 volts.

With transistor Q3 being turned on, current is drawn by the transistor and is driven through resistor R3. This current is essentially the same current as that through resistor R2 discussed above. This current is proportional to the bias current $I_S$ and results in a voltage V3 across resistor R3. This voltage is proportional to current $I_S$. It is to be noted that this voltage V3 rides on a DC level of 25.3 volts, as shown in the drawings. This provides a sensing mechanism for sensing the current $I_S$ being drawn by the amplifier so as to provide a proportional voltage V3.

The voltage V3, riding on the 25.3 DC voltage level, is supplied to a resistor R5 and which, in turn, is connected to the negative input of an operational amplifier U2. A reference voltage $V_R$ (on the order of +26.0 volts) is supplied to the positive input of amplifier U2. The reference voltage $V_R$ is obtained from a circuit including a resistor R4 connected in series with a diode CR1 between circuit points 20 and 22. In this embodiment, the voltage level at circuit point 22 is on the order of 28 volts and resistor R4 exhibits a resistance on the order of 1 kohm. The voltage drop $V_{BE}$ across diode CR1 is on the order of 0.7 volts. Consequently, the reference voltage $V_R$ is on the order of 26.0 volts. A current flows through resistor R5 proportional to the difference between the two voltage levels and this current flows around the feedback loop including resistor R6 and capacitor C1 connected together in series between the negative input and the output of amplifier U2. If the voltage V3 across resistor R3 exceeds the voltage $V_{BE}$, across diode CR1, then this current is positive and the output of amplifier U2 goes low. On the other hand, if the voltage $V_{BE}$ exceeds voltage V3, then this current is negative and the output of amplifier U2 goes high. This output is level shifted by the Zener diode CR3 to provide an amplifier control voltage $V_C$ across resistor R7.

The control voltage $V_C$ is applied to the cathodes of Schottky diodes CR4 and CR5. The RF signal is shunted away by capacitors C2 and C3 resulting in DC voltages only. The anodes of diodes CR4 and CR5 are attached to the gates of transistors Q1 and Q2 which operate at RF voltage levels. When the control voltage $V_C$ is high (approximately +10 volts), diodes CR4 and CR5 do not conduct as the AC waveform on the gates of transistors Q1 and Q2 does not exceed this voltage level. When the bias current $I_S$ exceeds the threshold current level $I_T$, then the control voltage $V_C$ is reduced, as discussed hereinbefore. Once the control voltage $V_C$ is sufficiently reduced, the diodes CR4 and CR5 begin to conduct sending current through resistor R7 to ground. This reduces the positive charge and voltage at the gates of transistors Q1 and Q2. This continues until the peak RF voltage on the gates of these transistors reaches a value on the order of $V_C+0.3$ volts. At this point, diodes CR4 and CR5 no longer conduct, stabilizing the maximum FET gate voltage. Thus, the control voltage $V_C$ has the effect of controlling the maximum FET gate voltage which is applied during the RF cycle. This, in turn, limits the maximum current which is drawn by the FET transistors Q1 and Q2. Simultaneously, the conduction angle has also been reduced due to the negative DC voltage (approximately −2.0 volts) now present on the FET gate electrodes of transistors Q1 and Q2. (The RF AC waveform has been shifted down by the clipping action of diodes CR4 and CR5 resulting in a time-average DC voltage which is less than the original level of zero.) The net effect of reducing the maximum FET current and reducing the conduction angle results in a reduced average current draw $I_S$ of the FET amplifier. This results in a reduced value of the voltage V3 developed across the resistor R3 and this reduction continues until V3 equals $V_{BE}$, which is the current threshold point at which $I_S$ equals $I_T$. At this point, the DC open loop is held at a balancing point which results in just the right value of $V_C$ for $I_S = I_T$.

In summation, when the amplifier begins to draw current in excess of the threshold level $I_T$, the controller CLC senses this and lowers the control voltage $V_C$ to a level which limits the value of $I_S$ to that of the threshold level $I_T$. When the amplifier is drawing less current than the threshold level $I_T$, the controller raises the control voltage $V_C$ to its maximum level which eliminates any current limiting of the FET amplifier. Thus, there is provided a current limiting controller CLC for controlling the operation of the RF power amplifier.

Although the invention has been described in conjunction with a preferred embodiment, it is to be appreciated that various modifications may be made without departing from the spirit and scope of the invention as defined by the appended claims.

Having described the invention, the following is claimed:

1. An AC power amplifier for amplifying an AC input signal while limiting the current drawn by said amplifier comprising:
   a DC voltage source for providing a DC voltage;
   means for providing a DC bias voltage;
   an AC source for providing an AC input signal;
   said amplifier including at least one transistor amplifier means having an input circuit for receiving said AC input signal and said DC bias voltage and an output circuit connected to said DC voltage source for drawing current from said source when said transistor amplifier means is conductive;
   said transistor amplifier means exhibiting the characteristic of being nonconductive when said AC input signal and said DC bias voltage together are less positive than a DC threshold voltage level and conductive when said AC input signal and said DC bias voltage together are more positive than said DC threshold voltage level whereupon DC current is drawn by said output circuit from said DC voltage source;
   means for sensing the magnitude of said DC current and providing a sense signal having a magnitude in accordance therewith;
   means for comparing said sense signal with a reference current level and providing a control signal having a value which varies as a function of said comparison; and
   means responsive to said control signal for decreasing said DC bias voltage when said sense current signal exceeds said reference current level to thereby decrease the conductivity of said transistor amplifier means to limit the magnitude of said DC current to that of said reference current level.

2. An AC power amplifier as set forth in claim 1 wherein said means for sensing the magnitude of said DC current includes a first resistor connected to said output circuit such that said DC current flows therethrough to develop a voltage thereacross.

3. An AC power amplifier as set forth in claim 2 including operational amplifier means having a pair of inputs and having one input connected to said first resistor, said operational amplifier means developing an output voltage in dependence upon any voltage difference between said input circuits.

4. An AC power amplifier as set forth in claim 3 including a second resistor connected between said DC voltage source and one of said inputs of said operational amplifier means.

5. An AC power amplifier as set forth in claim 4 including a third resistor and current sensing transistor amplifier means responsive to said output voltage for drawing current from said voltage source by way of said second resistor and supplying it to said third resistor for developing a third voltage thereacross and wherein said third voltage is proportional to said DC current.

6. An AC power amplifier as set forth in claim 5 wherein said means for comparing said sense signal includes means for comparing said third voltage with a reference and decreasing the magnitude of said control signal when said sense signal is greater than said reference current level.

7. An AC power amplifier as set forth in claim 6 wherein said means responsive to said control signal includes a peak detecting circuit connected to said input circuit of said transistor amplifier means.

8. An AC power amplifier as set forth in claim 7 including diode means connected to said input circuit in such a manner to permit said DC bias voltage to decrease as said control signal decreases.

9. An AC power amplifier as set forth in claim 1 wherein said at least one transistor amplifier means includes a field-effect transistor.

10. An AC power amplifier as set forth in claim 1 wherein said field-effect transistor is a MOSFET transistor.

* * * * *